(12) United States Patent
Cho

(10) Patent No.: US 10,468,476 B2
(45) Date of Patent: Nov. 5, 2019

(54) DISPLAY PANEL AND MANUFACTURING METHOD THEREOF AND DISPLAY DEVICE

(71) Applicants: HKC Corporation Limited, Shenzhen, Guangdong (CN); Chongqing HKC Optoelectronics Technology Co., Ltd., Chongqing (CN)

(72) Inventor: En-Tsung Cho, Chongqing (CN)

(73) Assignees: HKC CORPORATION LIMITED, Shenzhen, Guangdong (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 15/740,774

(22) PCT Filed: Oct. 20, 2017

(86) PCT No.: PCT/CN2017/107037
§ 371 (c)(1),
(2) Date: Dec. 28, 2017

(87) PCT Pub. No.: WO2019/041484
PCT Pub. Date: Mar. 7, 2019

(65) Prior Publication Data
US 2019/0067401 A1    Feb. 28, 2019

(30) Foreign Application Priority Data
Aug. 28, 2017  (CN) .......................... 2017 1 0752450

(51) Int. Cl.
*H01L 29/08*    (2006.01)
*H01L 33/00*    (2010.01)
(Continued)

(52) U.S. Cl.
CPC ........ *H01L 27/3269* (2013.01); *H01L 27/322* (2013.01); *H01L 27/3262* (2013.01);
(Continued)

(58) Field of Classification Search
CPC .............. H01L 27/3269; H01L 27/322; H01L 27/3246; H01L 27/3262; H01L 27/3276; H01L 27/3248
See application file for complete search history.

(56) References Cited

U.S. PATENT DOCUMENTS 8,519,386 B2 *  8/2013  Cho .................... H01L 27/1214
                                                        257/40
2013/0302923 A1 * 11/2013  Park ................... H01L 27/1218
                                                        438/29
(Continued)

*Primary Examiner* — Alonzo Chambliss
(74) *Attorney, Agent, or Firm* — Muncy, Geissler, Olds & Lowe, P.C.

(57) ABSTRACT

This application provides a display panel and a manufacturing method thereof and a display device. The display panel includes: a first substrate; gate lines formed on the first substrate; a gate coverage layer, formed on the first substrate, and covering the gate lines; data lines formed on the gate coverage layer; a passivation layer, formed on the gate coverage layer; an outer coating layer, formed on the passivation layer, where the outer coating layer includes a color filter; an anode electrode layer, formed on the outer coating layer; an embankment layer, formed on the outer coating layer, and covering the anode electrode layer; a pixel definition layer, formed on the embankment layer, and covering the anode electrode layer, where the pixel definition layer includes a white light emitting diode, a red sensor, a green sensor and a blue sensor.

20 Claims, 11 Drawing Sheets

(51) Int. Cl.
  *H01L 21/00*   (2006.01)
  *H01L 27/32*   (2006.01)
  *H01L 29/45*    (2006.01)
  *H01L 29/786*   (2006.01)

(52) U.S. Cl.
  CPC ...... *H01L 27/3276* (2013.01); *H01L 27/3246* (2013.01); *H01L 27/3258* (2013.01); *H01L 29/458* (2013.01); *H01L 29/78678* (2013.01); *H01L 2227/323* (2013.01); *H01L 2251/308* (2013.01)

(56) References Cited

U.S. PATENT DOCUMENTS

| | | | |
|---|---|---|---|
| 2014/0183499 A1* | 7/2014 | Kim | H01L 27/3213 257/40 |
| 2015/0187856 A1* | 7/2015 | Park | H01L 27/3272 257/40 |
| 2015/0188095 A1* | 7/2015 | Yoo | H01L 51/5284 257/40 |
| 2015/0221260 A1* | 8/2015 | Cho | G09G 3/3413 345/691 |
| 2015/0380466 A1* | 12/2015 | Koo | H01L 27/3258 257/40 |
| 2015/0380470 A1* | 12/2015 | Lee | H01L 27/3213 257/40 |
| 2017/0155071 A1* | 6/2017 | Han | H01L 27/322 |
| 2017/0186823 A1* | 6/2017 | Kim | H01L 27/3213 |
| 2019/0067388 A1* | 2/2019 | Cho | H01L 27/3246 |

\* cited by examiner

DISPLAY PANEL AND MANUFACTURING METHOD THEREOF AND DISPLAY DEVICE

BACKGROUND

Technical Field

This application relates to a manufacturing mode, and specifically, to a display panel and a manufacturing method thereof and a display device.

Related Art

Flat panel display equipment of various types is developed recently to replace bulky cathode ray tubes. The flat panel display equipment includes a liquid crystal display, a plasma display panel, an electrophoretic display and an organic light emitting display. At present, a high-pixel flat display panel is a market trend, an AMOLED (Active Matrix/Organic Light Emitting Diode) panel attracts everyone's attention, the AMOLED (Active Matrix/Organic Light Emitting Diode) panel dominates in a market of small-and-medium sized 200 ppi-pixel panels, a 200 ppi AMOLED WVGA (Wide Video Graphics Array) has a current mainstream resolution of 800*480, higher than the resolution of a VGA, and high-pixel 250 ppi, 300 ppi and 350 ppi will be a future development trend. A conventional AMOLED panel production mode is dominated by a side-by-side technology, but the technology has a certain difficulty in production of products of 300 ppi and above. Therefore, in the industry, the AMOLED panel may be manufactured in another implementation manner: a manner of WOLED (White Organic Light Emitting Diode) plus CF (Color Filter). The WOLED may be evaporated by using a totally-opened metal shield, so that high-pixel picture quality may be achieved. An OLED (Organic Light Emitting Device) has a great application potential because of the advantages of self-illumination, no view dependency, power saving, simple process, low cost, low temperature operating range, high response speed, full color and the like, and is expected to become a mainstream illumination source for a new-generation flat panel display.

A self-illumination display screen is characterized in high contrast, wide color gamut, high response speed and the like. Because of no need of a backlight panel, the self-illumination display screen can be lighter and thinner or even softer than the liquid crystal display. The ON-OFF and luminance of illumination devices are controlled and adjusted by means of a specific active switch array, and a self-illumination display mainly displays a picture after the proportion of three primary colors is adjusted. Herein, the active switch array for control often adopts a metal oxide semiconductor, not only having a higher ON state current and a lower OFF state current, but also having the characteristics of high uniformity and stability. A basic structure of an OLED (Organic Light Emitting Diode) is a sandwich structure formed by connecting a thin-and-transparent ITO (Indium-Tin Oxide) having semiconductor properties to an anode of electric power and adding another metal cathode, where a whole structure layer at least includes: an HIL (Hole Injection Layer), an HTL (Hole Transport Layer), an EL (Emitting Layer), an EIL (Electron Injection Layer) and an ETL (Electron Transport Layer). When the electric power is supplied to an appropriate voltage, an anode hole and a cathode charge will be combined in the emitting layer to emit light, and three primary colors, namely red, green and blue, are generated according to different recipes to form a basic color. However, it is often necessary to increase optical sensor processes, so as to make the manufacturing cost too high.

SUMMARY

To resolve the foregoing technical problems, an objective of this application is to provide a display panel and a manufacturing method thereof and a display device, a provided color filter including: a red photoresistor, a green photoresistor, a blue photoresistor and a white photoresistor. Since the pixel photoresistors are permuted and combined in different manners, the manufacturing cost can be reduced.

The objective of this application and the solution to the technical problems are implemented by using the following technical solutions. A display device provided according to this application includes: a first substrate; a plurality of gate lines, formed on the first substrate; a gate coverage layer, formed on the first substrate, and covering the plurality of gate lines; a plurality of data lines, formed on the gate coverage layer, where intersected parts of the plurality of data lines and the plurality of gate lines form a plurality of active switch arrays, and each of the active switch arrays has active layers of a channel region and a source and drain region, and a gate used to provide a signal for the channel region; a passivation layer, formed on the gate coverage layer, and covering a source and a drain in the source and drain region; an outer coating layer, formed on the passivation layer, where the outer coating layer includes a color filter; an anode electrode layer, formed on the outer coating layer, and connected to the source and the drain in the source and drain region and the gate separately; an embankment layer, formed on the outer coating layer, and covering the anode electrode layer; a pixel definition layer, formed on the embankment layer, and covering the anode electrode layer; and a cathode electrode layer, formed on the pixel definition layer, where the pixel definition layer includes a white light emitting diode, a red sensor, a green sensor and a blue sensor, the white light emitting diode and the red sensor being in arrayed arrangement, the white light emitting diode and the green sensor being in arrayed arrangement, and the white light emitting diode and the blue sensor being in arrayed arrangement.

This application provides a manufacturing method of a display device of another objective, including: providing a first substrate; forming a plurality of gate lines on the first substrate; forming a gate coverage layer on the first substrate, and covering the plurality of gate lines; forming a plurality of data lines on the gate coverage layer, where intersected parts of the plurality of data lines and the plurality of gate lines form a plurality of active switch arrays, and each of the active switch arrays has active layers of a channel region and a source and drain region, and a gate used to provide a signal for the channel region; forming a passivation layer on the gate coverage layer, and covering a source and a drain in the source and drain region; forming an outer coating layer on the passivation layer, the outer coating layer including a color filter; forming an anode electrode layer on the outer coating layer, and connecting to the source and the drain in the source and drain region and the gate separately; forming an embankment layer on the outer coating layer, and covering the anode electrode layer; forming a pixel definition layer on the embankment layer, and covering the anode electrode layer; and forming a cathode electrode layer on the pixel definition layer.

This application provides a display device of a further objective, including: a control component, and further including the display panel.

The solution of this application to the technical problems may also be further implemented by using the following technical measures.

In one embodiment of this application, the source and the drain include at least one of titanium, titanium alloy, tantalum and tantalum alloy.

In one embodiment of this application, the active layer includes polycrystalline silicon.

In one embodiment of this application, the color filter includes a red photoresistor, a green photoresistor, a blue photoresistor and a white photoresistor.

In one embodiment of this application, the anode electrode layer is an indium-tin oxide.

In one embodiment of this application, according to the manufacturing method, the source and the drain include at least one of titanium, titanium alloy, tantalum and tantalum alloy.

In one embodiment of this application, according to the manufacturing method, the active layer includes polycrystalline silicon.

In one embodiment of this application, according to the manufacturing method, the color filter includes a red photoresistor, a green photoresistor, a blue photoresistor and a white photoresistor; and the anode electrode layer is an indium-tin oxide.

This application has embedded sensors to improve the functions of display equipment, and has a color filter including: a red photoresistor, a green photoresistor, a blue photoresistor and a white photoresistor. The pixel photoresistors are permuted and combined in different manners, and the manufacturing cost can be reduced.

DETAILED DESCRIPTION

Figure 1A:
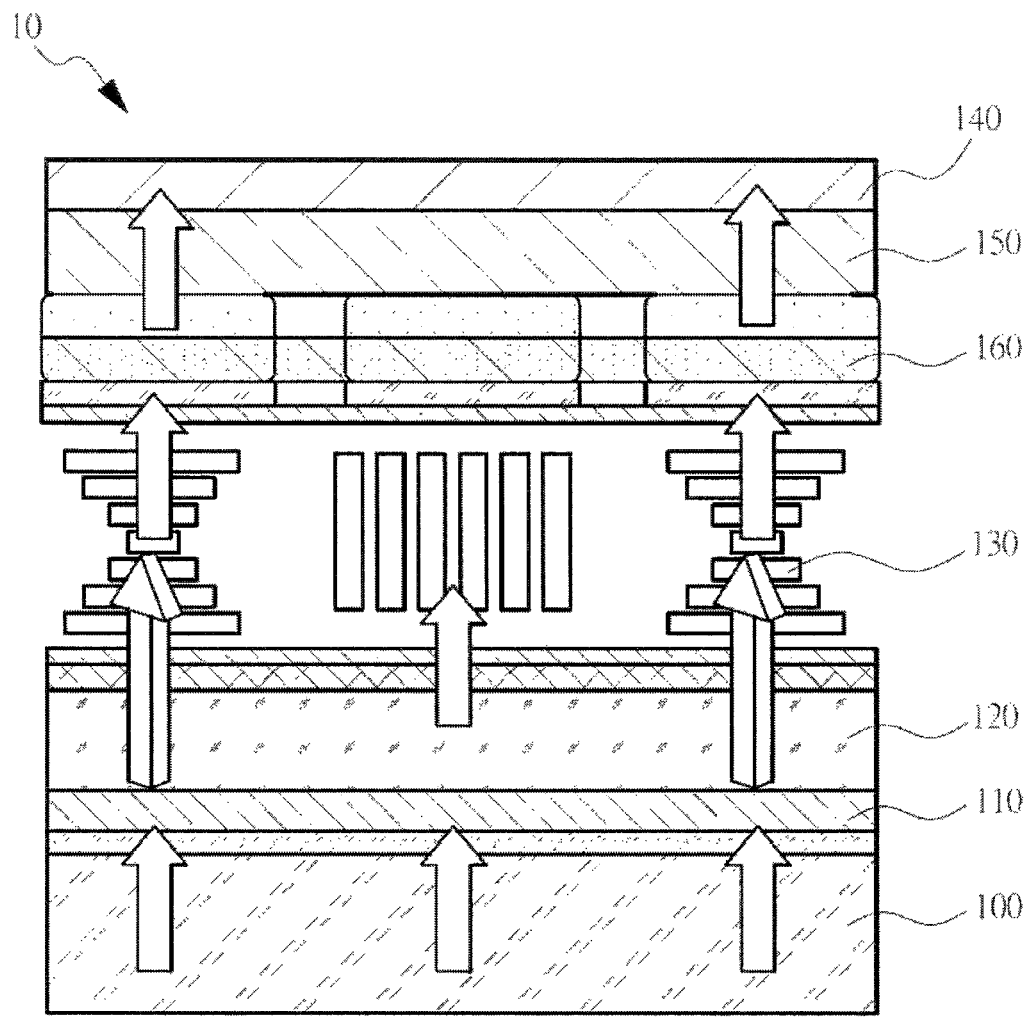
FIG. 1a is an exemplary schematic diagram of a cross section of an active switch array liquid crystal display device.

The following description for each embodiment is intended to exemplify a specific embodiment available to implementation in this application with reference to additional drawings. Nouns of locality mentioned in this application, such as "up", "down", "front", "back", "left", "right", "inside", "outside" and "lateral", are merely directions with reference to the additional drawings. Therefore, the adopted nouns of locality are intended to describe and understand this application, not intended to limit this application.

The drawings and description are regarded for showing instead of limitation in essence. In the drawings, structurally similar units are expressed with identical mark numbers. In addition, for convenience of understanding and description, the size and thickness of each assembly shown in the drawings are randomly shown, but this application is not limited thereto.

In the drawings, for clarity, a layer, a film, a panel, a region and the like are exaggerated in thickness. In the drawings, for convenience of understanding and description, some layers and regions are exaggerated in thickness. It will be appreciated that when an assembly of a layer, a film, a region or a substrate is called, for example, to be located "on" another assembly, the assembly may be directly located on the another assembly, or a middle assembly may exist.

In addition, in the specification, unless being definitely described to be contrary, the term "including" will be interpreted as including the assembly, but not excluding any other assemblies. Besides, in the specification, "on" refers to being above or below a target assembly, and does not refer to being necessarily located at the top based on a direction of gravity.

To further elaborate the technical means and functions adopted in this application for achieving a predetermined application objective, the detailed description, structures, characteristics and functions of a display panel and a manufacturing method thereof and a display device provided according to this application will be described in detail hereinafter with the drawings and preferred embodiments.

FIG. 1a is an exemplary schematic diagram of a cross section of active switch array liquid crystal display equipment. Referring to FIG. 1a, active switch array liquid crystal display equipment 10 includes: a backlight module 100; an active switch array glass substrate 120; a first polarizer 110, disposed on an outer surface of the active switch array glass substrate 120; a color filter layer glass substrate 150, opposite to the active switch array glass substrate 120; a color filter layer 160, formed on the color filter layer glass substrate 150; a liquid crystal layer 130, formed between the active switch array glass substrate 120 and the color filter layer glass substrate 150; and a second polarizer 140, disposed on an outer surface of the color filter layer glass substrate 150, where polarization directions of the first polarizer 110 and the second polarizer 140 are parallel to each other.

Figure 1B:
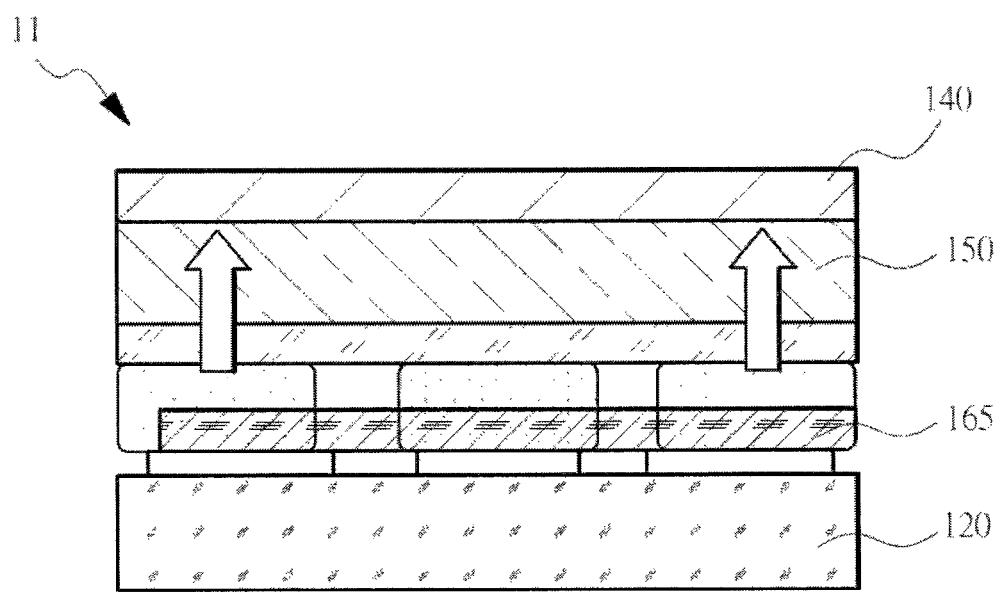
FIG. 1b is an exemplary schematic diagram of a cross section of an active matrix display panel.

FIG. 1b is an exemplary schematic diagram of a cross section of an active matrix display device. Referring to FIG. 1b, an active matrix display panel 11 includes: an active switch array glass substrate 120; a color filter layer glass substrate 150, opposite to the active switch array glass substrate 120; an organic material layer 165, disposed between the active switch array glass substrate 120 and the color filter layer glass substrate 150; and a polarizer 140, disposed on an outer surface of the color filter layer glass substrate 150.

Figure 1C:
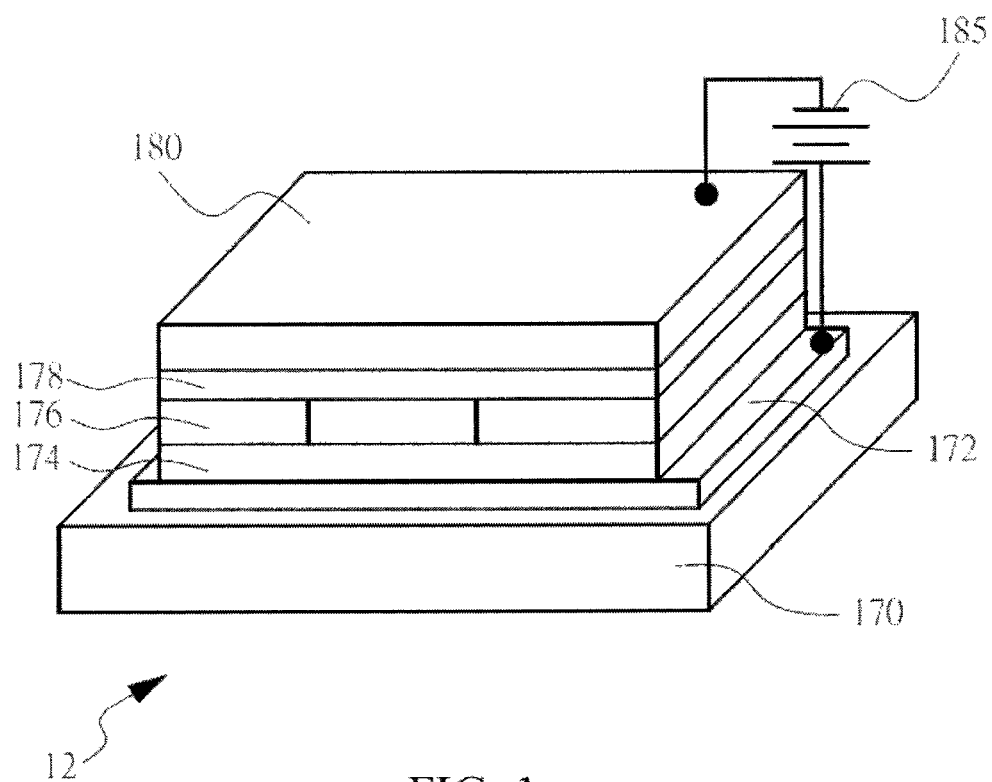
FIG. 1c is an exemplary schematic diagram of an organic light emitting diode.
Figure 1D:
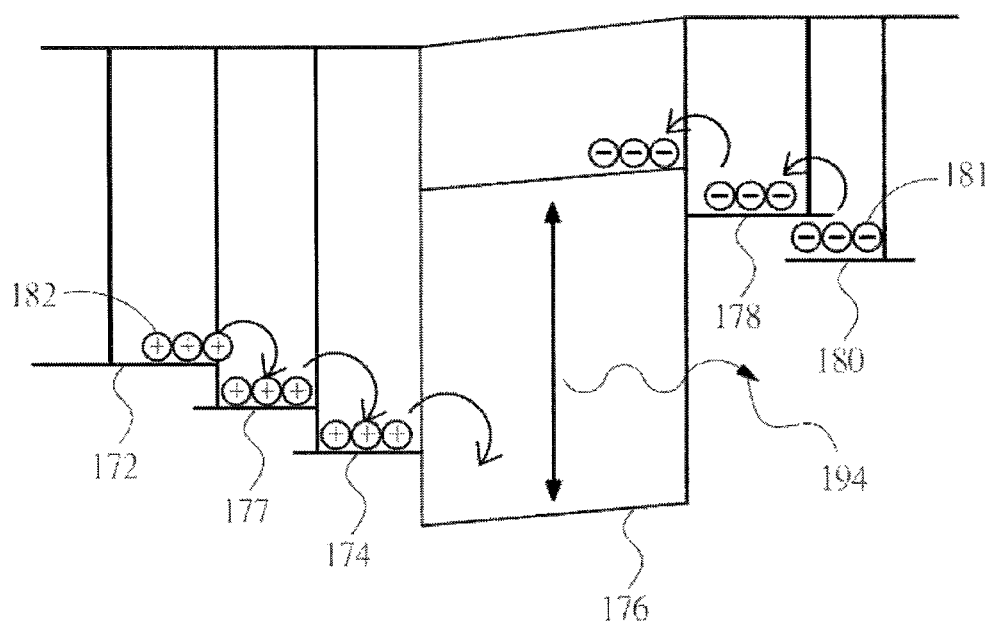
FIG. 1d is an exemplary structural diagram of an organic light emitting diode in the display-related art.

FIG. 1c is an exemplary schematic diagram of an organic light emitting diode and FIG. 1d is an exemplary structural diagram of an organic light emitting diode in the display-related art. Referring to FIG. 1c and FIG. 1d, an organic light emitting diode 12 includes: a glass substrate 170; and a thin-and-transparent ITO (Indium-Tin Oxide) having semiconductor properties, connected to an anode 172 of electric power 185 as well as another metal cathode 180 to form a sandwich structure, where a whole structure layer at least includes: an HIL (Hole Injection Layer) 177, an HTL (Hole Transport Layer) 174, an EL (Emitting Layer) 176, an EIL (Electron Injection Layer) (not shown in the figures) and an ETL (Electron Transport Layer) 178. When the electric power 185 is supplied to an appropriate voltage, a hole 182 of the anode 172 and a charge 181 of the cathode 180 will be combined in the emitting layer 176 to emit light 194, and three primary colors, namely red, green and blue, are generated according to different recipes to form a basic color.

Figure 2A:
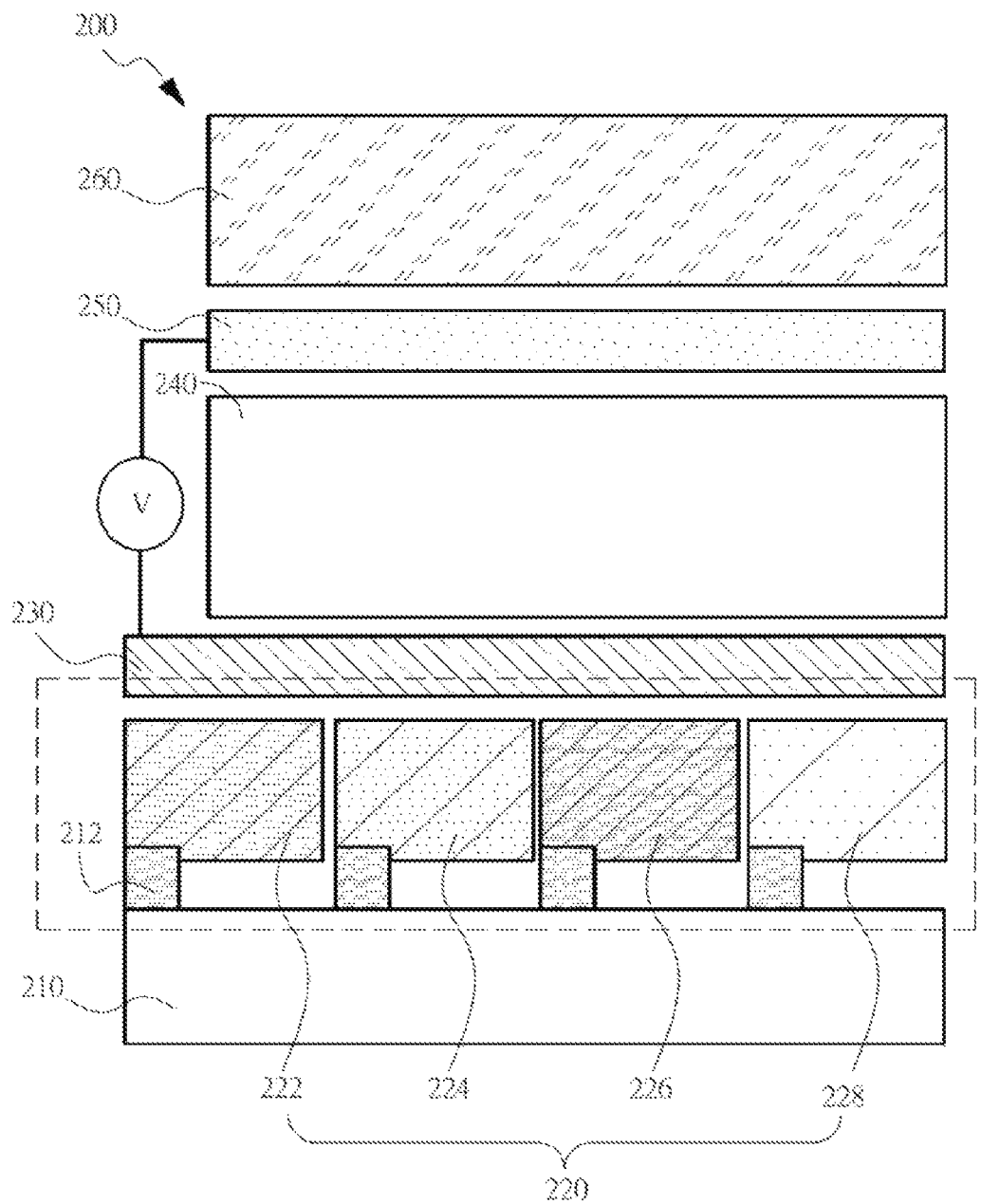
FIG. 2a is a schematic diagram of a cross section of an encapsulated sensor according to one embodiment of this application.
Figure 2B:
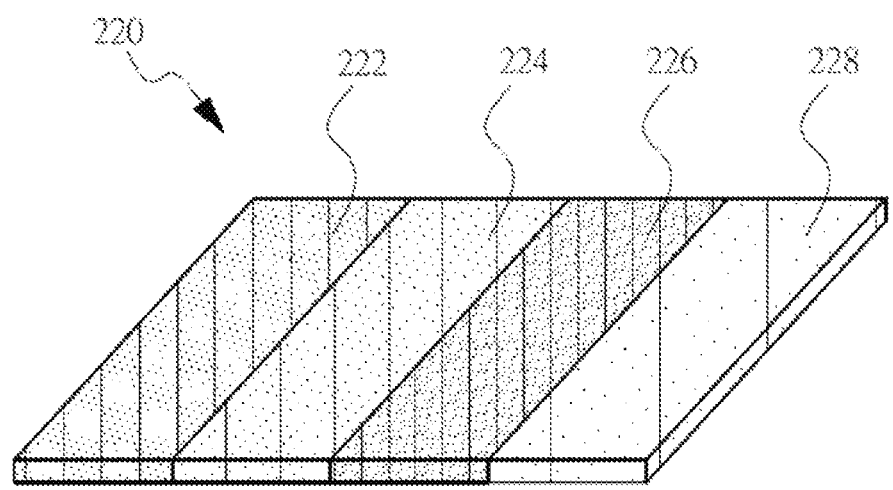
FIG. 2b is a schematic diagram of design arrangement of red, green, blue and white pixels according to one embodiment of this application.
Figure 2B:
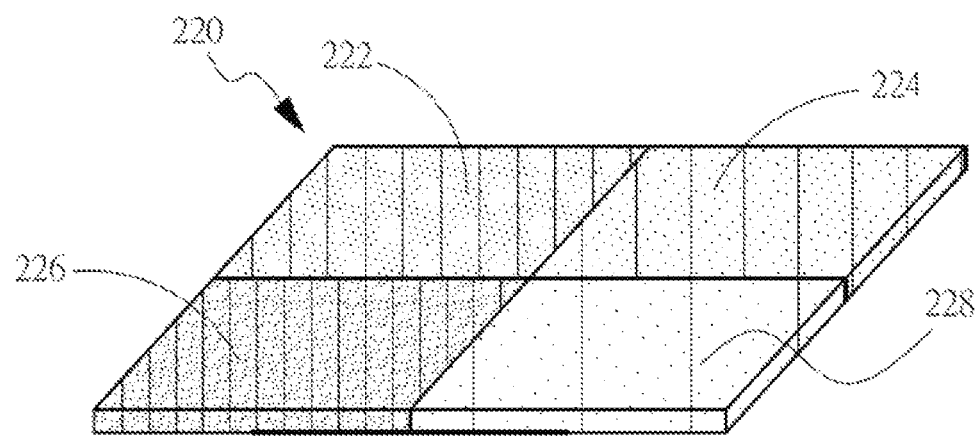

FIG. 2a is a schematic diagram of a cross section of an encapsulated sensor according to one embodiment of this application and FIG. 2b is a schematic diagram of design arrangement of red, green, blue and white pixels according to one embodiment of this application. Referring to FIG. 2a and FIG. 2b, an encapsulated sensor 200 includes: a substrate 210, an active switch array 212, a color filter 220, an anode 230, a pixel definition layer 240, a cathode 250 and an encapsulating unit 260. A hole of the anode 200 and a charge of the cathode 240 will be combined in the pixel definition layer 240 to emit light, and three primary colors, namely red, green and blue, are generated according to different recipes to form a basic color.

In one embodiment, the color filter 220 includes a red photoresistor 222, a green photoresistor 224, a blue photoresistor 226 and a white photoresistor 228.

Figure 3A:
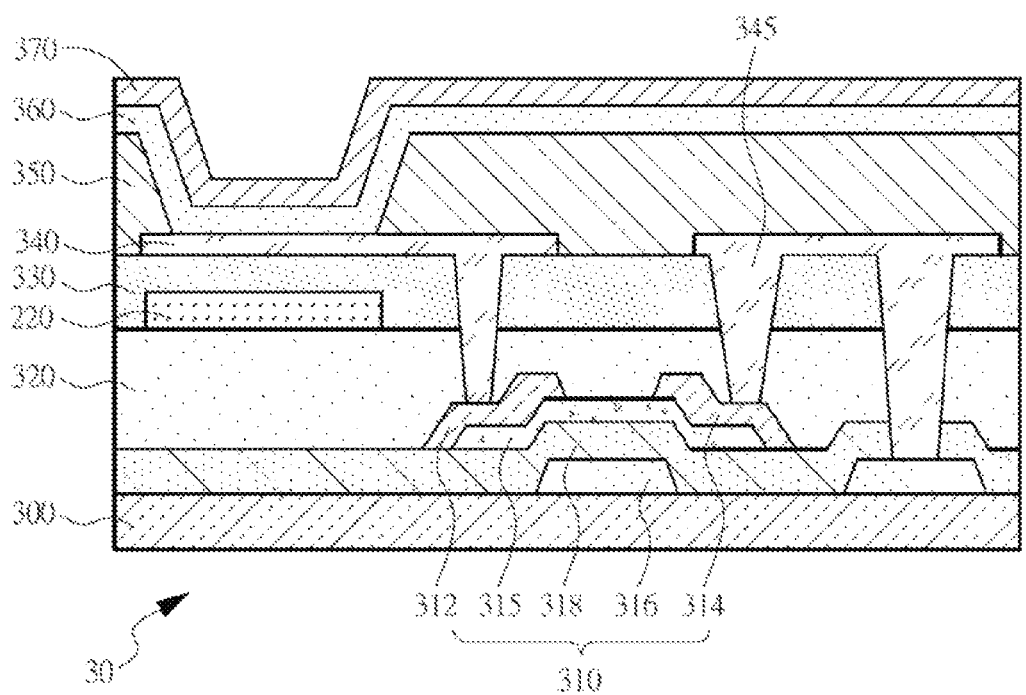
FIG. 3a is a schematic diagram of a cross section of a display panel having a color filter according to one embodiment of this application.
Figure 3B:
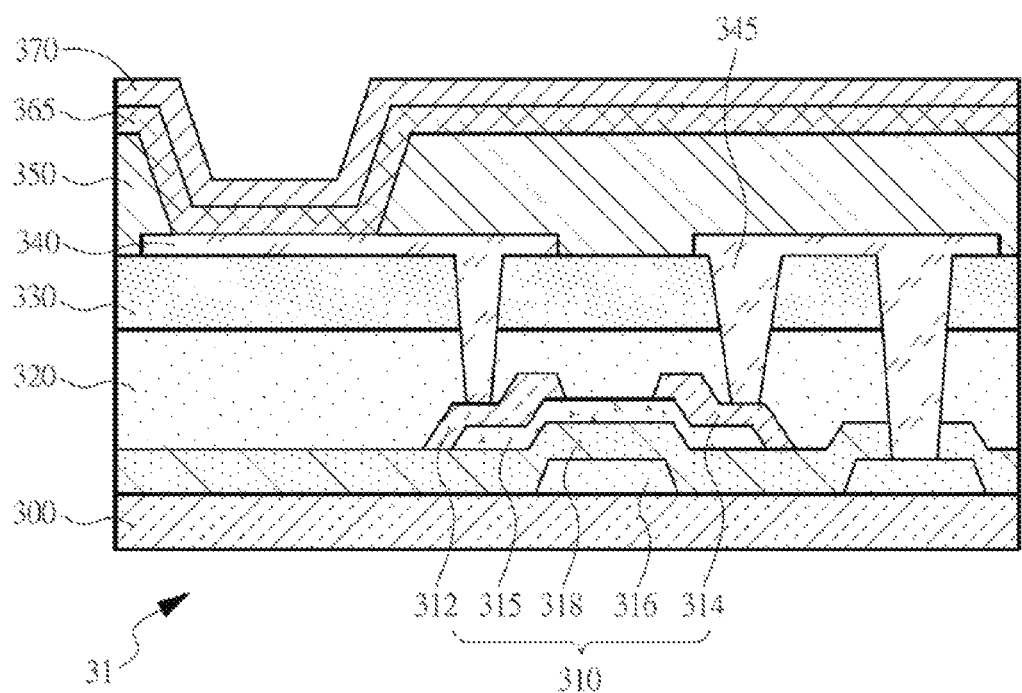
FIG. 3b is a schematic diagram of a cross section of a display panel having a pixel definition layer according to one embodiment of this application.
Figure 3C:
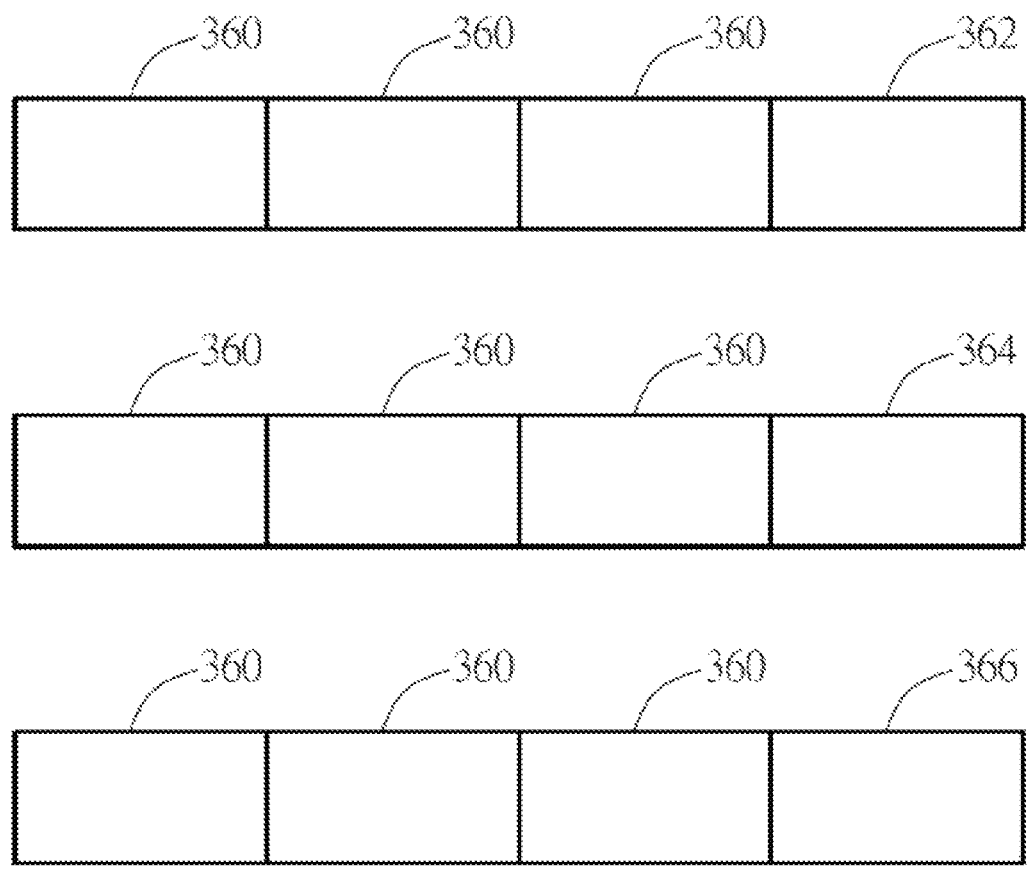
FIG. 3c is a schematic diagram of a pixel definition layer according to one embodiment of this application.

FIG. 3a is a schematic diagram of a cross section of a display panel having a color filter according to one embodiment of this application, FIG. 3b is a schematic diagram of a cross section of a display panel having a pixel definition layer according to one embodiment of this application, and FIG. 3c is a schematic diagram of a pixel definition layer according to one embodiment of this application. Referring to FIG. 2b, FIG. 3a, FIG. 3b and FIG. 3c, a display panel 30, 31 includes: a first substrate 300; a plurality of gate lines 316, formed on the first substrate 300; a gate coverage layer 318, formed on the first substrate 300, and covering the plurality of gate lines 316; a plurality of data lines 315, formed on the gate coverage layer 318, where intersected parts of the plurality of data lines 315 and the plurality of gate lines 316 form a plurality of active switch arrays 310, and each of the active switch arrays 310 has active layers 312, 314 of a channel region and a source 314 and drain 312 region, and a gate 316 used to provide a signal for the channel region; a passivation layer 320, formed on the gate coverage layer 318, and covering a source 314 and a drain 312 in the source 314 and drain 312 region; an outer coating layer 330, formed on the passivation layer 320, where the outer coating layer 330 includes a color filter 220; an anode electrode layer 340, 345, formed on the outer coating layer 330, and connected to the source 314 and the drain 312 in the source 314 and drain 312 region and the gate 316 separately; an embankment layer 350, formed on the outer coating layer 330, and covering the anode electrode layer 340, 345; a pixel definition layer 365, formed on the embankment layer 350, and covering the anode electrode layer 340; and a cathode electrode layer 370, formed on the pixel definition layer 365, where the pixel definition layer 365 includes a white light emitting diode 360, a red sensor 362, a green sensor 364 and a blue sensor 366, the white light emitting diode 360 and the red sensor 362 being in arrayed arrangement, the white light emitting diode 360 and the green sensor 364 being in arrayed arrangement, and the white light emitting diode 360 and the blue sensor 366 being in arrayed arrangement.

In one embodiment, the source 314 and the drain 312 include at least one of titanium, titanium alloy, tantalum and tantalum alloy.

In one embodiment, the active layer 312 and 314 includes polycrystalline silicon.

In one embodiment, the embankment layer 350 is in a shape of a narrow-top and wide-bottom bulge.

In one embodiment, the color filter 220 includes a red photoresistor 222, a green photoresistor 224, a blue photoresistor 226 and a white photoresistor 228.

In one embodiment, the anode electrode layer 340, 345 is an indium-tin oxide.

Referring to FIG. 3b, a display panel 31 includes: a first substrate 300; a plurality of gate lines 316, formed on the first substrate 300; a gate coverage layer 318, formed on the first substrate 300, and covering the plurality of gate lines 316; a plurality of data lines 315, formed on the gate coverage layer 318, where intersected parts of the plurality of data lines 315 and the plurality of gate lines 316 form a plurality of active switch arrays 310, and each of the active switch arrays 310 has active layers 312, 314 of a channel region and a source 314 and drain 312 region, and a gate 316 used to provide a signal for the channel region; a passivation layer 320, formed on the gate coverage layer 318, and covering a source 314 and a drain 312 in the source 314 and drain 312 region; an outer coating layer 330, formed on the passivation layer 320; an anode electrode layer 340, 345, formed on the outer coating layer 330, and connected to the source 314 and the drain 312 in the source 314 and drain 312 region and the gate 316 separately; an embankment layer 350, formed on the outer coating layer 330, and covering the anode electrode layer 340, 345; a pixel definition layer 365, formed on the embankment layer 350, and covering the anode electrode layer 340; and a cathode electrode layer 370, formed on the pixel definition layer 365.

In one embodiment, the source 314 and the drain 312 include at least one of titanium, titanium alloy, tantalum and tantalum alloy.

In one embodiment, the active layer 312 and 314 includes polycrystalline silicon.

In one embodiment, the embankment layer 350 is in a shape of a narrow-top and wide-bottom bulge.

In one embodiment, the anode electrode layer 340, 345 is an indium-tin oxide.

Referring to FIG. 2b and FIG. 3a, in one embodiment of this application, a manufacturing method of a display panel 30 includes: providing a first substrate 300; forming a plurality of gate lines 316 on the first substrate 300; forming a gate coverage layer 318 on the first substrate 300, and covering the plurality of gate lines 316; forming a plurality of data lines 315 on the gate coverage layer 318, where intersected parts of the plurality of data lines 315 and the plurality of gate lines 316 form a plurality of active switch arrays 310, and each of the active switch arrays 310 has active layers 312, 314 of a channel region and a source 314 and drain 312 region, and a gate 316 used to provide a signal for the channel region; forming a passivation layer 320 on the gate coverage layer 318, and covering a source 314 and a drain 312 in the source 314 and drain 312 region; forming an outer coating layer 330 on the passivation layer 320, the outer coating layer 330 including a color filter 220; forming an anode electrode layer 340, 345 on the outer coating layer 330, and connecting to the source 314 and the drain 312 in the source 314 and drain 312 region and the gate 316 separately; forming an embankment layer 350 on the outer coating layer 330, and covering the anode electrode layer 340, 345; forming an organic light emitting diode 360 on the embankment layer 350, and covering the anode electrode layer 340; and forming a cathode electrode layer 370 on the organic light emitting diode 360.

In one embodiment, according to the manufacturing method, the source 314 and the drain 312 include at least one of titanium, titanium alloy, tantalum and tantalum alloy.

In one embodiment, according to the manufacturing method, the active layer 312 and 314 includes polycrystalline silicon.

In one embodiment, according to the manufacturing method, the embankment layer 350 is in a shape of a narrow-top and wide-bottom bulge.

In one embodiment, according to the manufacturing method, the outer coating layer 330 includes a color filter 220, the color filter 220 including a red photoresistor 222, a green photoresistor 224, a blue photoresistor 226 and a white photoresistor 228.

In one embodiment, according to the manufacturing method, the anode electrode layer 340, 345 is an indium-tin oxide.

Figure 4A:
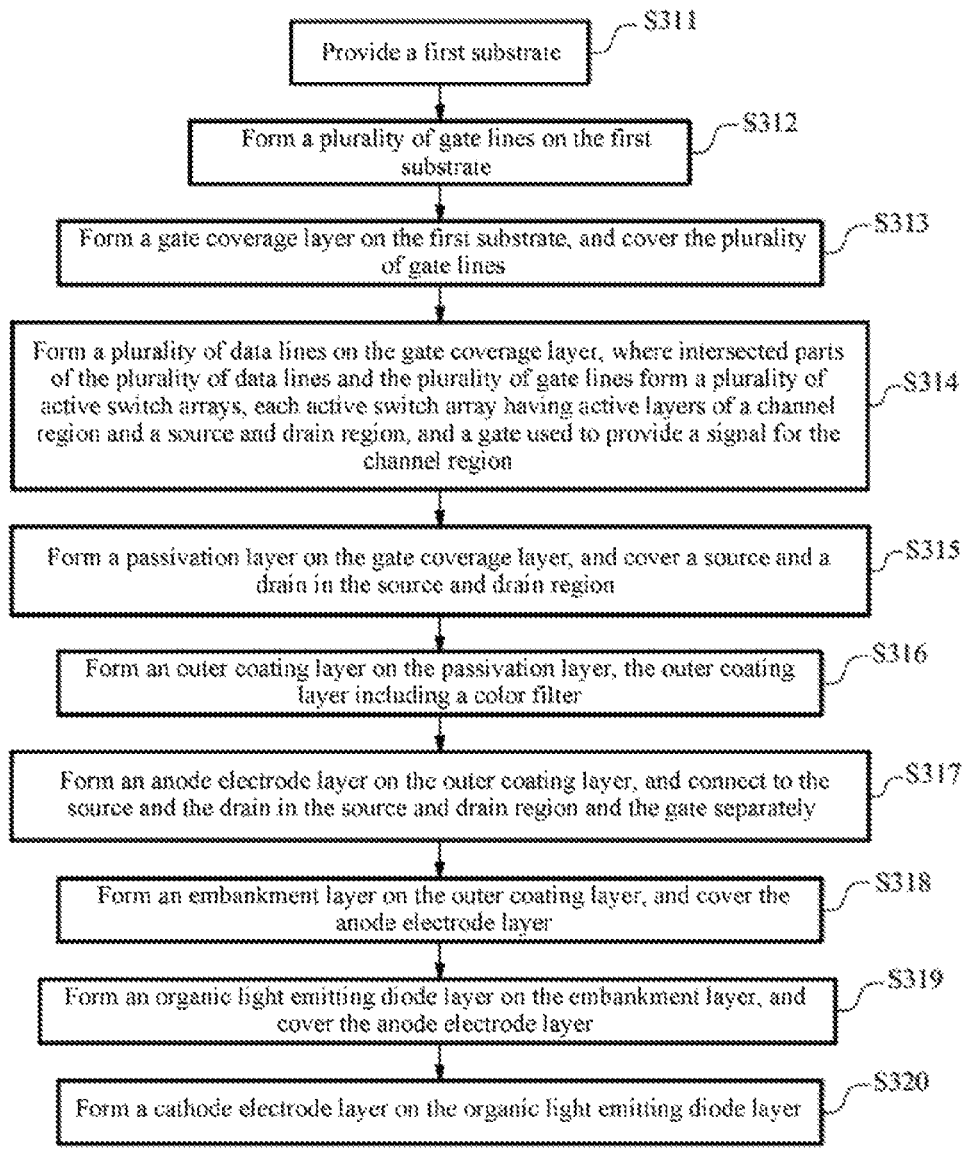
FIG. 4a is a flowchart of a manufacturing method of a display panel according to one embodiment of this application.

FIG. 4a is a flowchart of a manufacturing method of a display panel according to one embodiment of this application. Referring to FIG. 4a, in a flow S311, a first substrate is provided.

Referring to FIG. 4a, in a flow S312, a plurality of gate lines is formed on the first substrate.

Referring to FIG. 4a, in a flow S313, a gate coverage layer is formed on the first substrate, and covers the plurality of gate lines.

Referring to FIG. 4a, in a flow S314, a plurality of data lines is formed on the gate coverage layer, where intersected parts of the plurality of data lines and the plurality of gate lines form a plurality of active switch arrays, and each of the active switch arrays has active layers of a channel region and a source and drain region, and a gate used to provide a signal for the channel region.

Referring to FIG. 4a, in a flow S315, a passivation layer is formed on the gate coverage layer, and covers a source and a drain in the source and drain region.

Referring to FIG. 4a, in a flow S316, an outer coating layer is formed on the passivation layer, the outer coating layer including a color filter.

Referring to FIG. 4a, in a flow S317, an anode electrode layer is formed on the outer coating layer, and is connected to the source and the drain in the source and drain region and the gate separately.

Referring to FIG. 4a, in a flow S318, an embankment layer is formed on the outer coating layer, and covers the anode electrode layer.

Referring to FIG. 4a, in a flow S319, an organic light emitting diode layer is formed on the embankment layer, and covers the anode electrode layer.

Referring to FIG. 4a, in a flow S320, a cathode electrode layer is formed on the organic light emitting diode layer.

Referring to FIG. 3b, in one embodiment of this application, a manufacturing method of a display panel 31 includes: providing a first substrate 300; forming a plurality of gate lines 316 on the first substrate 300; forming a gate coverage layer 318 on the first substrate 300, and covering the plurality of gate lines 316; forming a plurality of data lines 315 on the gate coverage layer 318, where intersected parts of the plurality of data lines 315 and the plurality of gate lines 316 form a plurality of active switch arrays 310, and each of the active switch arrays 310 has active layers 312, 314 of a channel region and a source 314 and drain 312 region, and a gate 316 used to provide a signal for the channel region; forming a passivation layer 320 on the gate coverage layer 318, and covering a source 314 and a drain 312 in the source 314 and drain 312 region; forming an outer coating layer 330 on the passivation layer 320; forming an anode electrode layer 340, 345 on the outer coating layer 330, and connecting to the source 314 and the drain 312 in the source 314 and drain 312 region and the gate 316 separately; forming an embankment layer 350 on the outer coating layer 330, and covering the anode electrode layer 340, 345; forming a pixel definition layer 365 on the embankment layer 350, and covering the anode electrode layer 340; and forming a cathode electrode layer 370 on the pixel definition layer 365.

In one embodiment, according to the manufacturing method, the source 314 and the drain 312 include at least one of titanium, titanium alloy, tantalum and tantalum alloy.

In one embodiment, according to the manufacturing method, the active layer 312 and 314 includes polycrystalline silicon.

In one embodiment, according to the manufacturing method, the embankment layer 350 is in a shape of a narrow-top and wide-bottom bulge.

In one embodiment, according to the manufacturing method, the anode electrode layer 340, 345 is an indium-tin oxide.

Figure 4B:
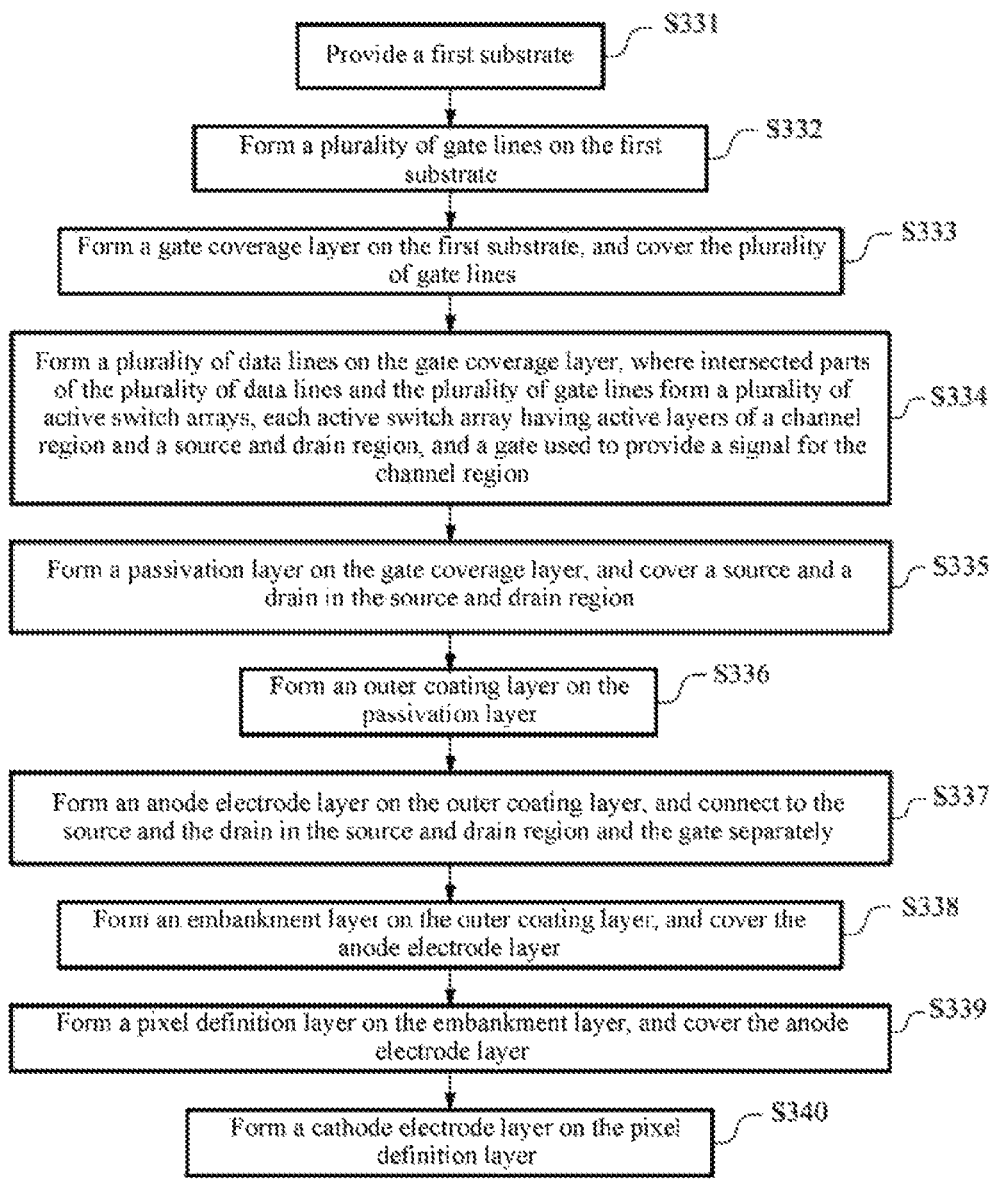
FIG. 4b is a flowchart of a manufacturing method of a display panel according to another embodiment of this application.

FIG. 4b is a flowchart of a manufacturing method of a display panel according to another embodiment of this application. Referring to FIG. 4b, in a flow S331, a first substrate is provided.

Referring to FIG. 4b, in a flow S332, a plurality of gate lines is formed on the first substrate.

Referring to FIG. 4b, in a flow S333, a gate coverage layer is formed on the first substrate, and covers the plurality of gate lines.

Referring to FIG. 4b, in a flow S334, a plurality of data lines is formed on the gate coverage layer, where intersected parts of the plurality of data lines and the plurality of gate lines form a plurality of active switch arrays, and each of the active switch arrays has active layers of a channel region and a source and drain region, and a gate used to provide a signal for the channel region.

Referring to FIG. 4b, in a flow S335, a passivation layer is formed on the gate coverage layer, and covers a source and a drain in the source and drain region.

Referring to FIG. 4b, in a flow S336, an outer coating layer is formed on the passivation layer.

Referring to FIG. 4b, in a flow S337, an anode electrode layer is formed on the outer coating layer, and is connected to the source and the drain in the source and drain region and the gate separately.

Referring to FIG. 4b, in a flow S338, an embankment layer is formed on the outer coating layer, and covers the anode electrode layer.

Referring to FIG. 4b, in a flow S339, a pixel definition layer is formed on the embankment layer, and covers the anode electrode layer.

Referring to FIG. 4b, in a flow S340, a cathode electrode layer is formed on the pixel definition layer.

In one embodiment of this application, a display device includes: a control component (for example, a multi-band antenna) (not shown in the figure), and further includes the display panel 30, 31 (for example, QLED or OLED).

This application has embedded sensors to improve the functions of display equipment, and has a color filter including: a red photoresistor, a green photoresistor, a blue photoresistor and a white photoresistor. The pixel photoresistors are permuted and combined in different manners, and the manufacturing cost can be reduced.

Phases "in some embodiments", "in various embodiments" and the like are repeatedly used. The phases do not refer to the same embodiment usually, but may refer to the same embodiment. Words "containing", "having", "including" and the like are synonyms unless other meanings are shown contextually.

The foregoing descriptions are merely preferred embodiments of this application, and are not intended to limit this application in any form. Although this application has been disclosed above through the preferred embodiments, the embodiments are not intended to limit this application. Any person skilled in the art can make some variations or modifications, namely, equivalent changes, according to the foregoing disclosed technical content to obtain equivalent embodiments without departing from the scope of the technical solutions of this application. Any simple amendment, equivalent change, or modification made to the foregoing embodiments according to the technical essence of this application without departing from the content of the technical solutions of this application shall fall within the scope of the technical solutions of this application.

What is claimed is:

1. A display panel, comprising:
   a first substrate;
   a plurality of gate lines, formed on the first substrate;
   a gate coverage layer, formed on the first substrate, and covering the plurality of gate lines;
   a plurality of data lines, formed on the gate coverage layer, wherein intersected parts of the plurality of data lines and the plurality of gate lines form a plurality of active switch arrays, and each of the active switch arrays has active layers of a channel region and a source and drain region, and a gate used to provide a signal for the channel region;
   a passivation layer, formed on the gate coverage layer, and covering a source and a drain in the source and drain region;
   an outer coating layer, formed on the passivation layer, wherein the outer coating layer comprises a color filter;
   an anode electrode layer, formed on the outer coating layer, and connected to the source and the drain in the source and drain region and the gate separately;
   an embankment layer, formed on the outer coating layer, and covering the anode electrode layer;
   a pixel definition layer, formed on the embankment layer, and covering the anode electrode layer; and
   a cathode electrode layer, formed on the pixel definition layer,
   wherein the pixel definition layer comprises a white light emitting diode, a red sensor, a green sensor and a blue sensor, the white light emitting diode and the red sensor being in arrayed arrangement, the white light emitting diode and the green sensor being in arrayed arrangement, and the white light emitting diode and the blue sensor being in arrayed arrangement.

2. The display panel of claim 1, wherein the source comprises at least one of titanium, titanium alloy, tantalum and tantalum alloy.

3. The display panel of claim 1, wherein the drain comprises at least one of titanium, titanium alloy, tantalum and tantalum alloy.

4. The display panel of claim 1, wherein the active layer comprises polycrystalline silicon.

5. The display panel of claim 1, wherein the color filter comprises a red photoresistor, a green photoresistor, a blue photoresistor and a white photoresistor.

6. The display panel of claim 1, wherein the anode electrode layer is an indium-tin oxide.

7. The display panel of claim 1, wherein the embankment layer is in a shape of a narrow-top and wide-bottom bulge.

8. A manufacturing method of a display panel, comprising:
   providing a first substrate;
   forming a plurality of gate lines on the first substrate;
   forming a gate coverage layer on the first substrate, and covering the plurality of gate lines;
   forming a plurality of data lines on the gate coverage layer, wherein intersected parts of the plurality of data lines and the plurality of gate lines form a plurality of active switch arrays, and each of the active switch arrays has active layers of a channel region and a source and drain region, and a gate used to provide a signal for the channel region;
   forming a passivation layer on the gate coverage layer, and covering a source and a drain in the source and drain region;
   forming an outer coating layer on the passivation layer, the outer coating layer comprising a color filter;
   forming an anode electrode layer on the outer coating layer, and connecting to the source and the drain in the source and drain region and the gate separately;
   forming an embankment layer on the outer coating layer, and covering the anode electrode layer;
   forming a pixel definition layer on the embankment layer, and covering the anode electrode layer; and
   forming a cathode electrode layer on the pixel definition layer.

9. The manufacturing method of a display panel of claim 8, wherein the source comprises at least one of titanium, titanium alloy, tantalum and tantalum alloy.

10. The manufacturing method of a display panel of claim 8, wherein the drain comprises at least one of titanium, titanium alloy, tantalum and tantalum alloy.

11. The manufacturing method of a display panel of claim 8, wherein the active layer comprises polycrystalline silicon.

12. The manufacturing method of a display panel of claim 8, wherein the color filter comprises a red photoresistor, a green photoresistor, a blue photoresistor and a white photoresistor.

13. The manufacturing method of a display panel of claim 8, wherein the anode electrode layer is an indium-tin oxide.

14. The manufacturing method of a display panel of claim 8, wherein the embankment layer is in a shape of a narrow-top and wide-bottom bulge.

15. A display device, comprising: a control component, and
   a display panel, comprising:
   a first substrate;
   a plurality of gate lines, formed on the first substrate;
   a gate coverage layer, formed on the first substrate, and covering the plurality of gate lines;
   a plurality of data lines, formed on the gate coverage layer, wherein intersected parts of the plurality of data lines and the plurality of gate lines form a plurality of active switch arrays, and each of the active switch arrays has active layers of a channel region and a source and drain region, and a gate used to provide a signal for the channel region;

a passivation layer, formed on the gate coverage layer, and covering a source and a drain in the source and drain region;
an outer coating layer, formed on the passivation layer, wherein the outer coating layer comprises a color filter;
an anode electrode layer, formed on the outer coating layer, and connected to the source and the drain in the source and drain region and the gate separately;
an embankment layer, formed on the outer coating layer, and covering the anode electrode layer;
a pixel definition layer, formed on the embankment layer, and covering the anode electrode layer; and
a cathode electrode layer, formed on the pixel definition layer,
wherein the pixel definition layer comprises a white light emitting diode, a red sensor, a green sensor and a blue sensor, the white light emitting diode and the red sensor being in arrayed arrangement, the white light emitting diode and the green sensor being in arrayed arrangement, and the white light emitting diode and the blue sensor being in arrayed arrangement.

16. The display device of claim 15, wherein the source and the drain comprise at least one of titanium, titanium alloy, tantalum and tantalum alloy.

17. The display device of claim 15, wherein the active layer comprises polycrystalline silicon.

18. The display device of claim 15, wherein the color filter comprises a red photoresistor, a green photoresistor, a blue photoresistor and a white photoresistor.

19. The display device of claim 15, wherein the anode electrode layer is an indium-tin oxide.

20. The display device of claim 15, wherein the embankment layer is in a shape of a narrow-top and wide-bottom bulge.

* * * * *